(12) United States Patent
Nakajima et al.

(10) Patent No.: US 9,087,962 B2
(45) Date of Patent: Jul. 21, 2015

(54) THERMOELECTRIC CONVERSION MODULE

(71) Applicants: NIPPON THERMOSTAT CO., LTD., Kiyose-Shi, Tokyo (JP); TOKYO UNIVERSITY OF SCIENCE EDUCATIONAL FOUNDATION ADMINISTRATIVE ORGANIZATION, Shinjuku-Ku, Tokyo (JP)

(72) Inventors: Tadao Nakajima, Tokyo (JP); Takashi Nemoto, Tokyo (JP); Junichi Sato, Tokyo (JP)

(73) Assignees: Nippon Thermostat Co., Ltd., Tokyo (JP); Tokyo University Of Science Educational Foundation Administrative Organization, Tokyo (JP)

(*) Notice: Subject to any disclaimer, the term of this patent is extended or adjusted under 35 U.S.C. 154(b) by 0 days.

(21) Appl. No.: 14/354,232

(22) PCT Filed: Oct. 25, 2012

(86) PCT No.: PCT/JP2012/077648
§ 371 (c)(1),
(2) Date: Apr. 25, 2014

(87) PCT Pub. No.: WO2013/080719
PCT Pub. Date: Jun. 6, 2013

(65) Prior Publication Data
US 2014/0338716 A1 Nov. 20, 2014

(30) Foreign Application Priority Data

Nov. 30, 2011 (JP) .................................. 2011-262472

(51) Int. Cl.
*H01L 35/32* (2006.01)
*H01L 35/16* (2006.01)

(52) U.S. Cl.
CPC ................ *H01L 35/32* (2013.01); *H01L 35/16* (2013.01)

(58) Field of Classification Search
CPC ........................................................ H01L 35/32
USPC ........................ 136/212, 205, 203; 62/3.2, 3.3
See application file for complete search history.

(56) References Cited

U.S. PATENT DOCUMENTS 3,607,444 A * 9/1971 DeBucs ........................ 136/208
3,617,390 A * 11/1971 De Bucs et al. ............... 136/211
(Continued)

FOREIGN PATENT DOCUMENTS

JP         2535680 Y2    5/1997
JP      2000-150971 A    5/2000
(Continued)

OTHER PUBLICATIONS

Office Action dated May 12, 2015 of counterpart Japanese Application No. 2011-262472.

*Primary Examiner* — Golam Mowla
(74) *Attorney, Agent, or Firm* — Carrier Blackman & Associates, P.C.; Joseph P. Carrier; Fulchand P. Shende

(57) ABSTRACT

To improve the mass productivity of thermoelectric conversion modules. A thermoelectric conversion module 1 is equipped with a pair of substrates 11 and 12, a plurality of thermoelectric conversion elements 2, each having one end portion electrically connected to a first electrode 3 which is arranged on the substrate 11 and the other end portion electrically connected to a second electrode 4 which is arranged on the substrate 12, and a connection section 5 which electrically connects the first electrode 3 electrically connected to the thermoelectric conversion element 2 to the second electrode 4 electrically connected to an adjacent one of the thermoelectric conversion elements 2. The connection section 5 is separate from at least one of the first electrode 3 and the second electrode 4.

6 Claims, 11 Drawing Sheets

(56) References Cited

U.S. PATENT DOCUMENTS

| | | | | |
|---|---|---|---|---|
| 3,714,539 | A * | 1/1973 | Hampl, Jr. | 322/2 R |
| 3,884,726 | A * | 5/1975 | Landecker | 136/203 |
| 4,497,973 | A * | 2/1985 | Heath et al. | 136/212 |
| 2003/0033818 | A1 * | 2/2003 | Kucherov et al. | 62/3.1 |
| 2005/0155642 | A1 * | 7/2005 | Chen | 136/252 |
| 2007/0095381 | A1 * | 5/2007 | Lee | 136/230 |
| 2010/0288325 | A1 * | 11/2010 | Takahashi | 136/205 |
| 2011/0139203 | A1 * | 6/2011 | Yap | 136/205 |
| 2012/0000500 | A1 | 1/2012 | Iida et al. | |

FOREIGN PATENT DOCUMENTS

| | | |
|---|---|---|
| JP | 2001-230454 A | 8/2001 |
| JP | 2009-176919 A | 8/2009 |
| JP | 2009-284633 A | 12/2009 |
| JP | 2010205883 A | 9/2010 |

* cited by examiner

THERMOELECTRIC CONVERSION MODULE

TECHNICAL FIELD

The present invention relates to a thermoelectric conversion module for generating power using the Seebeck effect or performing cooling or heating using the Peltier effect.

BACKGROUND ART

A thermoelectric conversion module is conventionally known in which a plurality of thermoelectric conversion elements, each having a first electrode at one end portion and a second electrode at the other end portion, are arranged between one pair of facing substrates (see, e.g., Japanese Patent Laid-Open No. 2009-176919).

The thermoelectric conversion module in Japanese Patent Laid-Open No. 2009-176919 has a connection section which integrally connects the first electrode of each thermoelectric conversion element and the second electrode of the adjacent thermoelectric conversion element, which constitutes a U-shaped connector. The connector is formed by bending a metal plate. When a thermoelectric conversion module is to be manufactured, a plurality of U-shaped connectors are fixed to a substrate in advance. Each thermoelectric conversion element is pushed sideways into a corresponding one of the U-shaped connectors to be inserted between a first electrode and a second electrode and is connected to the connector.

SUMMARY OF INVENTION

Technical Problem

In a conventional thermoelectric conversion module, a thermoelectric conversion element needs to be pushed into a U-shaped connector, which causes the problems of the difficulty of assembly and low mass productivity.

In consideration of the above-described circumstances, the present invention has as its object to provide a thermoelectric conversion module with improved mass productivity.

Solution to Problem

[1] In order to attain the above-described object, according to the present invention, there is provided a thermoelectric conversion module comprising one pair of substrates, a plurality of thermoelectric conversion elements, each having one end portion electrically connected to a first electrode which is arranged on one of the substrates and the other end portion electrically connected to a second electrode which is arranged on the other of the substrates, and a connection section which electrically connects the first electrode electrically connected to the thermoelectric conversion element to a second electrode electrically connected to an adjacent one of the thermoelectric conversion elements, the plurality of thermoelectric conversion elements are composed of only one of n-type thermoelectric conversion elements and p-type thermoelectric conversion elements, the connection section is intended to electrically connect adjacent two of thermoelectric conversion elements in series and is separate from the first electrode and the second electrode, the first electrode and the second electrode each comprise an element arrangement section which is electrically connected to the thermoelectric conversion element and a protruding section which protrudes from the element arrangement section along the substrates, and the protruding piece has a connection hole provided, therein into which the connection section is inserted.

According to the present invention, since the connection section is separate, it is possible to electrically connect one of the first electrode and the second electrode to one end of the thermoelectric conversion element and connect the one to an electrode electrically connected to an adjacent one of the thermoelectric conversion elements via the connection section after electrically connecting the other end of each thermoelectric conversion element to the other of the first electrode and the second electrode. Additionally, since each thermoelectric conversion element need not be pushed into a U-shaped connector, unlike a conventional thermoelectric conversion module, assembly can be performed by installing all components from the same direction. Thus, the thermoelectric conversion module according to the present invention can achieve improvement in mass productivity.

[2] The present invention can also be configured as follows: the connection section has a rod shape or a plate shape and is inserted in connection holes which are provided in the protruding pieces to be electrically connected to the first electrode and the second electrode; two axes which extend along the substrates and are orthogonal to each other are assumed to be an X-axis and a Y-axis; a plurality of the thermoelectric conversion elements arranged in a direction of the X-axis on the substrates constitute an element array, a plurality of the element arrays are arranged in a direction of the Y-axis; the thermoelectric conversion elements in each of the element arrays are staggered; the first electrodes or the second electrodes that are L-shaped are arranged on the substrate on a side where a terminal, from which electricity is derived, of the element array that is provided with the terminal is arranged; the L-shaped first electrodes or second electrodes each have the connection hole arranged in the direction of the X-axis with respect to the element arrangement section; and the electrodes in the element array adjacent to the element array with the L-shaped first electrodes or second electrodes arranged therein each have the connection hole arranged in the direction of the Y-axis with respect to the element arrangement section.

According to this configuration, since the connection section has a rod shape or a plate shape, the connection section has relatively high rigidity, which allows easy insertion of the connection section into the connection holes of the first electrode and the second electrode. Thus, the mass productivity of thermoelectric conversion modules can be further improved.

Additionally, in the L-shaped first electrode or second electrode, the element arrangement section and the protruding piece are arranged so as to be located in the direction of the X-axis and the protruding piece is arranged in the Y-axis direction side with respect to the element arrangement section of an adjacent one of the electrodes in the same element array so as to stand clear of the staggered thermoelectric conversion elements. Each electrode on the same substrate in the element array adjacent to this element array is configured such that the element arrangement section and the protruding piece are located in the Y-axis direction side.

Thus, in the thermoelectric conversion module, the number of thermoelectric conversion elements arranged in the direction of the X-axis can be increased, and the area used exclusively by (the element density of) thermoelectric conversion elements per unit area can be increased over the entire thermoelectric conversion module.

[3] In the present invention, it is preferable that an even number of the element arrays are arranged in the direction of the Y-axis and that the first electrodes and the second electrodes arranged on the two substrates are arranged in a same pattern on the corresponding substrates by being arranged on the substrates so as to be symmetric with respect to the direction of the Y-axis.

According to this configuration, the layout of the first electrodes on the substrate and the layout of the second electrodes on the substrate can be made the same, and the substrate with the first electrodes and the substrate with the second electrodes can be manufactured in a same manner. Thus, the thermoelectric conversion module according to the present invention can achieve further improvement in mass productivity.

[4 and 5] in the present invention, it is preferable that the electrodes in the element array adjacent to the element array with the L-shaped first electrodes or second electrodes arranged therein have a rectangular shape and that at least one of two corners at a distal end of the protruding piece is notched.

According to this configuration, a notch of the protruding piece of the rectangular electrode allows clear distinction between the element arrangement section and the protruding piece and prevention of wrong arrangement in opposite orientation on the substrate. Although it is also conceivable to notch corners of the element arrangement section, the process reduces the contact area of the element arrangement section with the thermoelectric conversion element. The above-described notching of the corners at the distal end of the protruding piece can prevent wrong arrangement of the rectangular electrode on the substrate without reducing the arrangement area of the thermoelectric conversion element.

[6] The present invention may also be configured as follows: two axes are assumed to be an X-axis and a Y-axis; a plurality of the thermoelectric conversion elements arranged in a direction of the X-axis on the substrates constitute an element array; a plurality of the element arrays are arranged in a direction of the V-axis; the thermoelectric conversion elements are arranged at positions shifted in the direction of the X-axis between adjacent element arrays; among one of the first electrodes and the second electrodes, an array-to-array connection electrode which connects each adjacent two of the element arrays is formed in an L-shape in a current path through which current produced through thermoelectric conversion flows; and the protruding section is narrower than the element arrangement section and is arranged in a space which is made due to the shift of the thermoelectric conversion elements in the element, array adjacent to the protruding piece.

According to this configuration, the mass productivity can be improved, and the area used exclusively by (the element density of) thermoelectric conversion elements per unit area on the substrate can be made relatively large (high).

DESCRIPTION OF EMBODIMENTS

First Embodiment

Figure 1:
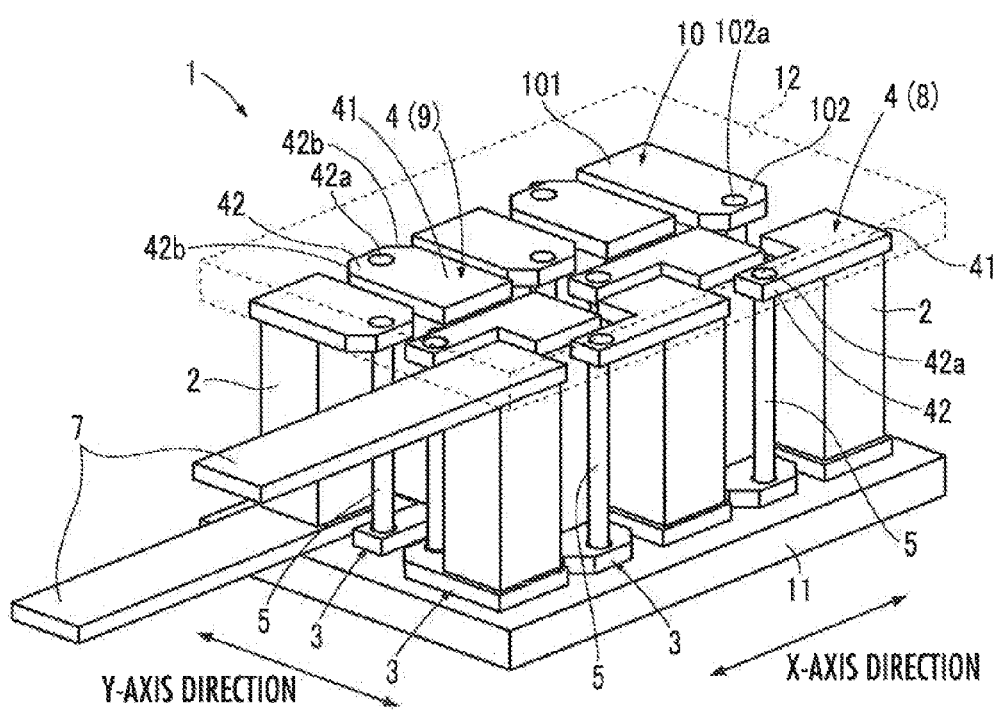
FIG. 1 is a perspective view showing a first embodiment of a thermoelectric conversion module according to the present invention.
Figure 2:
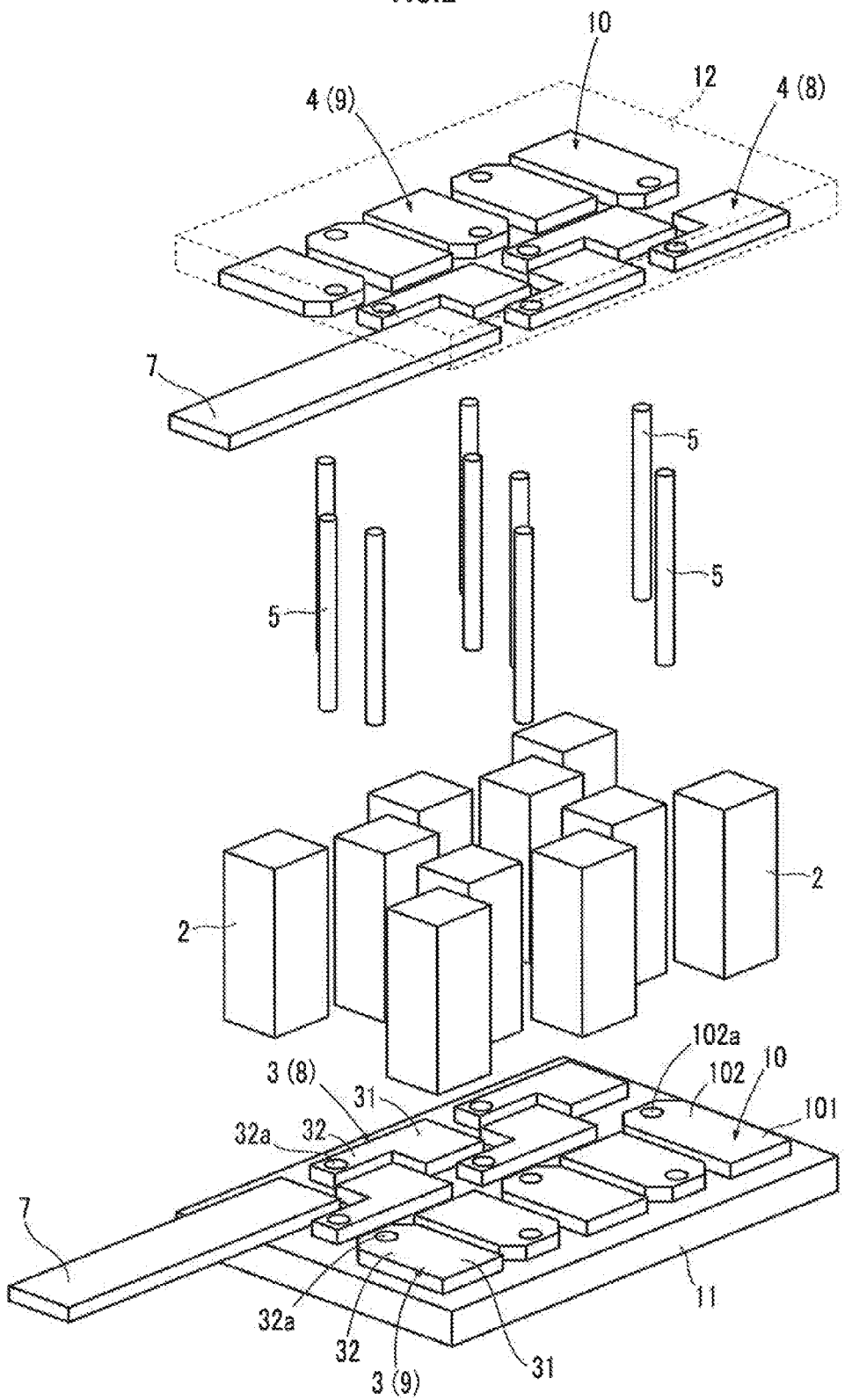
FIG. 2 is a perspective view showing, in an exploded manner, a thermoelectric conversion module according to the first embodiment.
Figure 3:
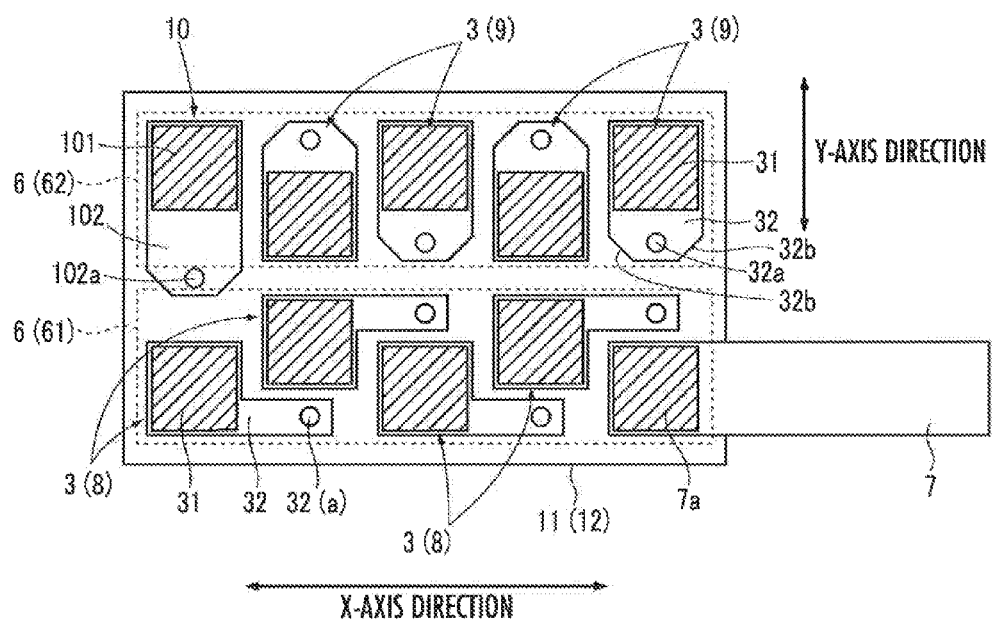
FIG. 3 is an explanatory view showing the arrangement of electrodes according to the first embodiment.

A thermoelectric conversion module according to a first embodiment of the present invention will be described with reference to FIGS. 1 to 3. A thermoelectric conversion module 1 according to the first embodiment shown in FIG. 1 comprises one pair of substrates 11 and 12 which are formed of aluminum oxide and have insulating properties. In FIGS. 1 and 2, for better viewability of the interior of the thermoelectric conversion module 1, the substrate 12 located on the upper side is indicated by broken lines, as if the substrate 12 was transparent. The same applies to FIGS. 4, 6, and 9 (to be described later).

A plurality of first electrodes 3 and a plurality of second electrodes 4 which are each made of a Ni plate are provided on facing surfaces of each of the substrates 11 and 12. An n-type thermoelectric conversion element 2 made of $Mg_2Si$ is arranged between each pair of electrodes 3 and 4.

A BiTe-based material, a PbTe-based material, or a CoSb-based material has been conventionally used as the material for a thermoelectric conversion element. All these materials cause harm (including something that is at risk of becoming harmful) to humans and are expensive. In contrast, $Mg_2Si$ is unharmful to humans and environmentally-friendly and is abundantly available and inexpensive. Additionally, since $Mg_2Si$ has a small specific gravity, it allows formation of the thermoelectric conversion element 2 that is very light. For this reason, $Mg_2Si$ has received attention as the material for a thermoelectric conversion element in recent years.

Note that the substrates 11 and 12 are not limited to aluminum oxide and may be formed of any other material. Additionally, the electrodes 3 and 4 are not limited to Ni, and electrodes of any other material may be used.

One end of the thermoelectric conversion element 2 is bonded to the first electrode 3 while the other end is bonded to the second electrode 4. As a bonding method, brazing and soldering, such as soldering or brazing, adhesion with a conductive adhesive, such as silver paste, or diffusion bonding can be used. The bonding method is appropriately selected according to the intended use or the like of the thermoelectric conversion module.

If the bonding is performed by brazing and soldering, paste of wax (solder) may be applied to the two end portions of the thermoelectric conversion element 2 in advance. Although surfaces of the thermoelectric conversion element 2 are surfaces having fine asperities, the surfaces can be made smooth by covering the asperities of the surfaces with wax (solder), silver paste, or the like. The smoothing improves the state of bonding between the thermoelectric conversion element 2 and the electrodes 3 and 4 and ensures excellent conductivity.

The first electrode 3 and the second electrode 4 comprise element arrangement sections 31 and 41, respectively, on which the thermoelectric conversion element 2 is arranged and protruding pieces 32 and 42, respectively, which protrude from the element arrangement sections 31 and 41 along the substrates 11 and 12.

The protruding pieces 32 and 42 have connection holes 32a and 42a, respectively, into which a connection section 5 in the shape of a circular cylindrical rod is to be inserted. The connection section 5 is inserted into the connection hole 32a provided in the first electrode 3 and the connection hole 42a provided in the second electrode 4 of another adjacent to the thermoelectric conversion element 2 to electrically connect the two electrodes 3 and 4. Note that although Ni is used for the connection section 5, as for the electrodes 3 and 4, the present invention is not limited to this and that any other metal may be used.

Insertion-side edges of the connection holes 32a and 42a are tapered for ease of insertion of the connection section 5 into the connection holes 32a and 42a. Note that the connection section 5 is not limited to the shape of a circular cylindrical rod. The connection section 5 may have the shape of a polygonal (e.g., quadrangular) cylindrical rod or may be plate-shaped. The insertion-side edges of the connection holes 32a and 42a may not be tapered.

The above-described formation of the connection section 5 in the shape of a rod or a plate with high rigidity allows easy insertion of the connection section 5 into the connection holes 32a and 42a of the electrodes 3 and 4. The connection section 5 and the connection holes 32a and 42a may be electrically connected through brazing and soldering, such as soldering or brazing. Alternatively, end portions of the connection section 5 may be subjected to knurling, and the connection section 5 may be press fit into the connection holes 32a and 42a.

Assume here that two axes which extend along surfaces of the substrates 11 and 12 and are orthogonal to each other are an X-axis and a Y-axis. Referring to FIG. 3, a horizontal direction is an X-axis direction while a vertical direction is a Y-axis direction. A plurality of thermoelectric conversion elements 2 arranged in the X-axis direction on the substrates 11 and 12 constitute an element array 6. A plurality of element arrays 6 are arranged in the Y-axis direction. In each element array 6, the thermoelectric conversion elements 2 are staggered. The first electrodes 3 or second electrodes 4 that are L-shaped are arranged on the substrate 11 or 12 on the side where a terminal 7 for input and output, from which electricity is derived, of the element array 6 that is provided with the terminal 7 is arranged. The L-shaped first electrode 3 or second electrode 4 is defined as an L-shaped electrode 8.

The element array 6 with the L-shaped electrodes 3 or 4 arranged is referred to as a first element array 61 while the element array 6 that is adjacent to the first element array 61 is referred to as a second element array 62. The electrode 3 or 4 of the second element array 62 comprises the electrode 3 or 4 that is rectangular (oblong) with the connection hole 32a or 42a arranged in the Y-axis direction with respect to the thermoelectric conversion element 2. The rectangular (oblong) electrode 3 or 4 is defined as a rectangular electrode 9.

The terminal 7 is formed in the shape of an oblong which protrudes far from an element arrangement section 7a to outside the substrates 11 and 12. Obliquely cut notches 32b, 42b are provided at two corners of a distal end of the protruding piece 32, 42. The notches 32b and 42b allow clear distinction between the element arrangement sections 31 and 41 and the protruding pieces 32 and 42 and prevention of wrong arrangement in opposite orientation on the substrates 11 and 12.

Note that although the notch 32b or 42b is provided at both of the two corners at the distal end of the protruding piece 32 or 42 in the present embodiment, a notch according to the present invention is not limited to this. For example, a notch may be provided at only one of the two corners at the distal end of each protruding piece 32 or 42. Although linearly obliquely cut notches are shown as the notches 32b and 42b in the present embodiment, a notch may be cut in a curved line state.

Although it is also conceivable to notch corners of the element arrangement sections 31 and 41, the process reduces the contact area of the element arrangement section 31 or 41 with the thermoelectric conversion element 2. By providing the notches 32b and 42b at the corners of the distal ends of the protruding pieces 32 and 42 as described above, wrong arrangement of the rectangular electrode 9 on the substrates 11 and 12 can be prevented without reducing the arrangement area of the thermoelectric conversion element 2.

The protruding piece 32 or 42 of the L-shaped electrode 8 in the first element array 61 protrudes in the X-axis direction with respect to the element arrangement section 31 or 41. The connection hole 32a or 42a of the L-shaped electrode 8 in the first element array 61 is provided in the protruding piece 32 or 42 so as to be located in the Y-axis direction side with respect to the element arrangement section 31 or 41 of the adjacent L-shaped electrode 8 in the same element array 6. The adjacent L-shaped electrodes 8 are arranged by being alternately flipped in the Y-axis direction.

The protruding piece 32 or 42 of the rectangular electrode 9 in the second element array 62 protrudes in the Y-axis direction with respect to the element arrangement section 31 or 41. The adjacent rectangular electrodes 9 are arranged by being alternately flipped in the Y-axis direction.

An even number (two in the present embodiment) of element arrays 6 (alternate first and second element arrays 61 and 62) are arranged in the Y-axis direction. The first electrodes 3 and the second electrodes 4 are arranged on the corresponding substrates, respectively, in the same pattern.

The two substrates 11 and 12 each comprise an array-to-array connection electrode 10 to connect in series adjacent two element arrays 6. The array-to-array connection electrode 10 is formed to have a shape similar to the shape of the rectangular electrode 9 and is formed to be slightly longer in the Y-axis direction than the rectangular electrode 9. Like the rectangular electrode 9, the array-to-array connection electrode 10 comprises an element arrangement section 101, a protruding piece 102 which protrudes from the element arrangement section 101 toward the L-shaped electrode 8 in the adjacent first element array 61, and a connection hole 102a which is bored in the protruding piece 102. The connection hole 102a is provided so as to be located in the middle between the two element arrays 61 and 62.

With the above-described configuration, the first electrodes 3 arranged on the substrate 11 located on the lower side and the second electrodes 4 arranged on the substrate 12 located on the upper side are configured in the same manner. One of the substrates 11 and 12 is flipped, and the substrates 11 and 12 are arranged such that the electrodes 3 and 4 face each other. In this manner, the two substrates 11 and 12 and the two electrodes 3 and 4 can be thrilled. Thus, the thermoelectric conversion module 1 according to the first embodiment can have higher mass productivity than a conventional product.

Note that although a thermoelectric conversion element in the shape of a quadrangular cylinder is shown as the thermoelectric conversion element 2 according to the first embodiment in FIG. 2, the present invention is not limited to this. For example, the thermoelectric conversion element 2 may have any other shape, such as a circular cylindrical shape.

The action of the thermoelectric conversion module 1 according to the first embodiment will now be described. When the substrate 12 of the thermoelectric conversion module 1 is attached to a heat source, and the substrate 11 is cooled, a temperature difference occurs between the two ends of each thermoelectric conversion element 2. Due to the Seebeck effect, a current flows to generate power. In order to continue power generation, a predetermined temperature difference needs to be maintained between the two ends of the thermoelectric conversion element 2. Since $Mg_2Si$ with low thermal conductivity is used as the material for the thermoelectric conversion element 2 in the first embodiment, the temperature difference can be favorably maintained.

In the thermoelectric conversion module 1 according to the first embodiment, the connection section 5 is separate from the electrodes 3 and 4. For this reason, alter the one end of each thermoelectric conversion element 2 is connected to the first electrode 3 fixed to the substrate 11, it is possible to electrically connect the second electrode 4 fixed to the substrate 12 to the other end of the thermoelectric conversion element. 2 and connect the connection section 5 to the connection holes 32a and 42a of the first electrode 3 and the second electrode 4 such that the two electrodes 3 and 4 are electrically connected between the thermoelectric conversion elements 2. Thus, a thermoelectric conversion element need not be pushed into as U-shaped connector, unlike a conventional thermoelectric conversion module. This improves the mass productivity of thermoelectric conversion modules. Alternatively, the plurality of thermoelectric conversion elements 2 and the plurality of connection sections 5 may be assembled and bonded by simultaneously sandwiching the thermoelectric conversion elements 2 and the connection sections 5 between the upper and lower substrates 11 and 12.

Note that although the thermoelectric conversion element 2 is formed of $Mg_2Si$ in the first embodiment the present invention is not limited to this. For example, any thermoelectric conversion material, such as one of Bi—Te-based materials including Sb—Te-based materials and Bi—Se-based materials, a Pb—Te-based materials including: Sn—Te-based materials and Ge—Te-based materials, a Ag—Sb—Te-based material, a Ag—Sb—Ge—Te-based material, a Si—Ge-based material, a Fe—Si-based material, a Mn—Si-based material, a Zn—Sb-based material, chalcogenide, skutterudite, filled skutterudite, boron carbide, or layered cobalt oxide can be used. The thermoelectric conversion element 2 is not limited to an n-type, and a p-type may be used. $Mg_2Si$ need not be highly pure and may be obtained by utilizing, for example, waste silicone sludge which is discharged at the time of grinding and polishing.

A bonding layer may be provided at the two end portions of the thermoelectric conversion element 2 to reduce the contact resistance to the electrodes. The bonding layer can also be formed integrally with the thermoelectric conversion element. Any material, such as Ni, Al, Cu, W, Au, Ag, Co, Mo, Cr, Ti, Pd, and alloys thereof, can be used as the materials for the bonding layer and the electrodes.

Although the thermoelectric conversion module 1 for power generation using the Seebeck effect has been described in the first embodiment, a thermoelectric conversion module according to the present invention can also be used as a thermoelectric conversion module which performs cooling or heating using the Peltier effect.

Second Embodiment

Figure 4:
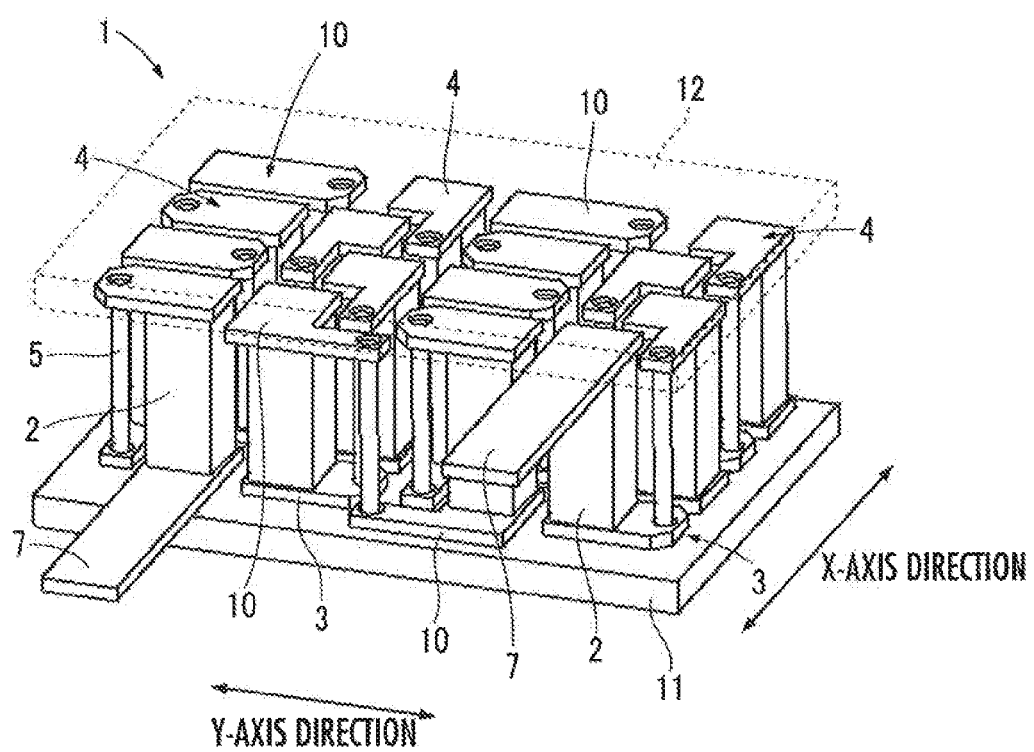
FIG. 4 is a perspective view showing a second embodiment of a thermoelectric conversion module according to the present invention.
Figure 5:
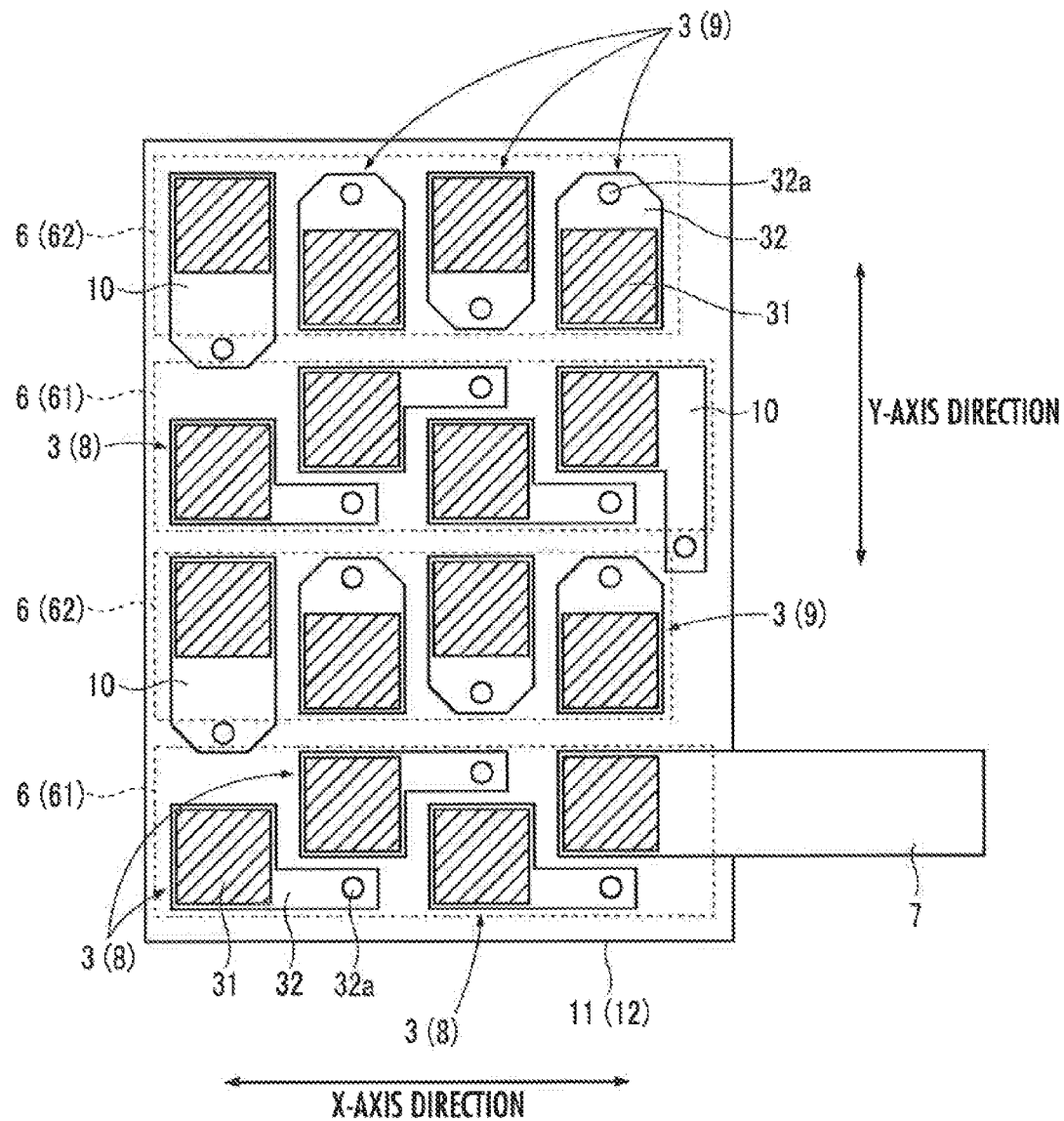
FIG. 5 is an explanatory view showing the arrangement of electrodes according to the second embodiment.

A thermoelectric conversion module 1 according to a second embodiment will be described with reference to FIGS. 4 and 5. Note that, for better viewability of the interior of the thermoelectric conversion module 1, a substrate 12 which is located on the upper side is indicated by broken lines in FIG. 4, as if the substrate 12 was transparent.

In the thermoelectric conversion module 1 according to the second embodiment, the number of thermoelectric conversion elements 2 which are arranged in an X-axis direction of one element array 6 is set to four that is smaller by one, and four element arrays 6 are arranged in a Y-axis direction. Two of the element arrays 6 which are located in a central portion are electrically connected by an L-shaped array-to-array connection electrode 10. The other components are the same as those in the first embodiment.

As can be seen from the second embodiment, any number of element arrays 6 can be arranged in the Y-axis direction as long as the number is an even number with the thermoelectric conversion module according to the first embodiment as a constitutional unit. Any number of thermoelectric conversion elements can be provided in the X-axis direction in each element array 6.

It is thus relatively easy to change the size of the thermoelectric conversion module 1.

Third Embodiment

Figure 6:
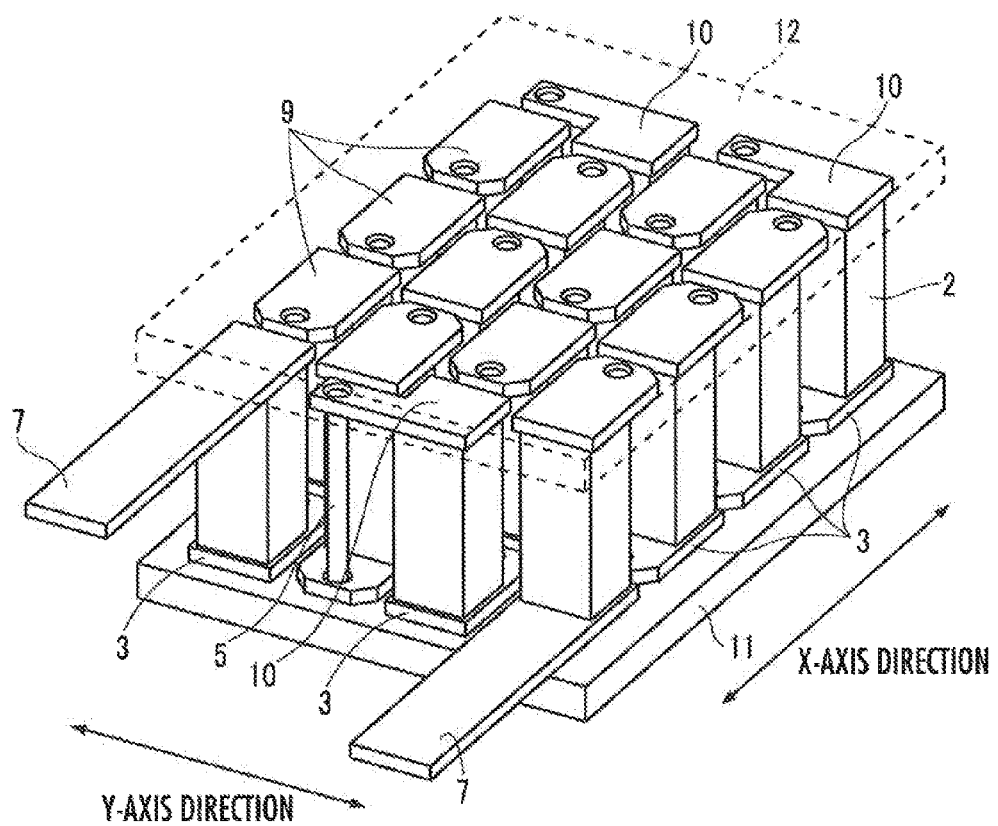
FIG. 6 is a perspective view showing a third embodiment of a thermoelectric conversion module according to the present invention.
Figure 7:
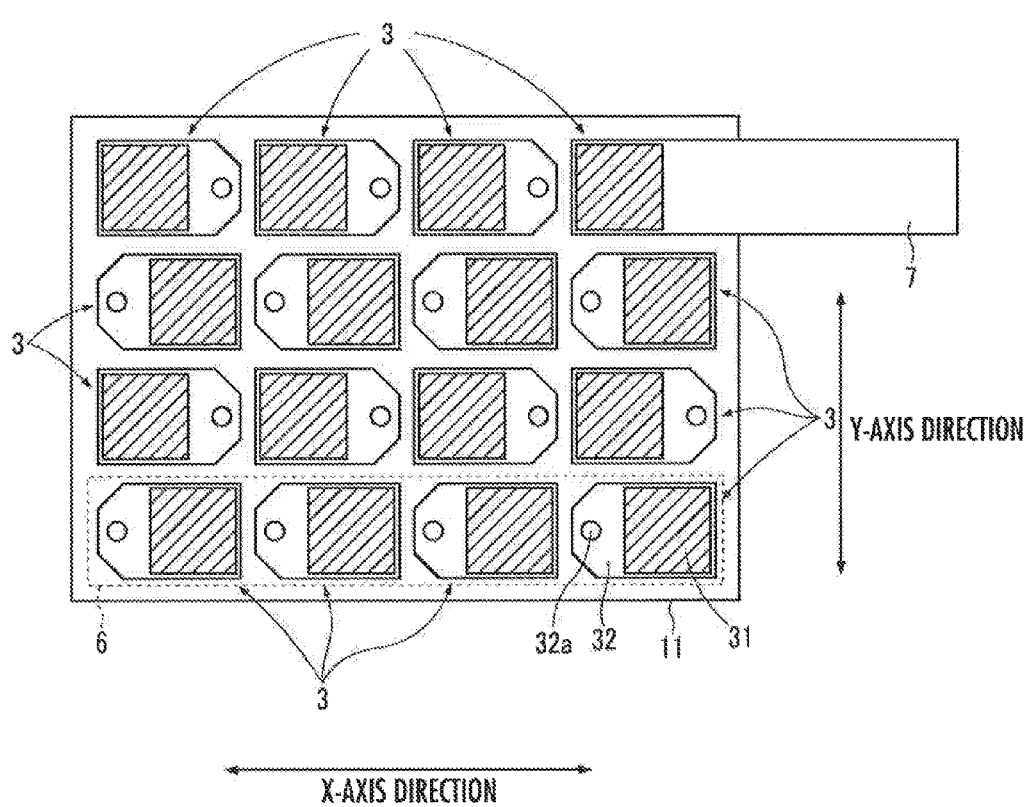
FIG. 7 is an explanatory view showing electrodes which are arranged on a substrate on the lower side of a thermoelectric conversion module according to the third embodiment.

A thermoelectric conversion module 1 according to a third embodiment of the present invention will be described with reference to FIGS. 6 to 8. Note that, for better viewability of the interior of the thermoelectric conversion module 1, a substrate 12 which is located on the upper side is indicated by broken lines in FIG. 6, as if the substrate 12 was transparent.

Thermoelectric conversion elements 2 of the thermoelectric conversion module 1 according to the third embodiment are arranged such that the positions of the thermoelectric conversion elements 2 are shifted in an X-axis direction between the adjacent element arrays 6. As shown in FIG. 7, first electrodes 3 which are arranged on a substrate 11 on the lower side are all formed in the same shape, a rectangular shape (an oblong shape). Connection holes 32a of the first electrodes 3 are all arranged in the X-axis direction with respect to corresponding element arrangement sections 31. The arrangement of the element arrangement section 31 and the connection hole 32a is configured to reverse in the X-axis direction in the adjacent two element arrays 6.

Figure 8:
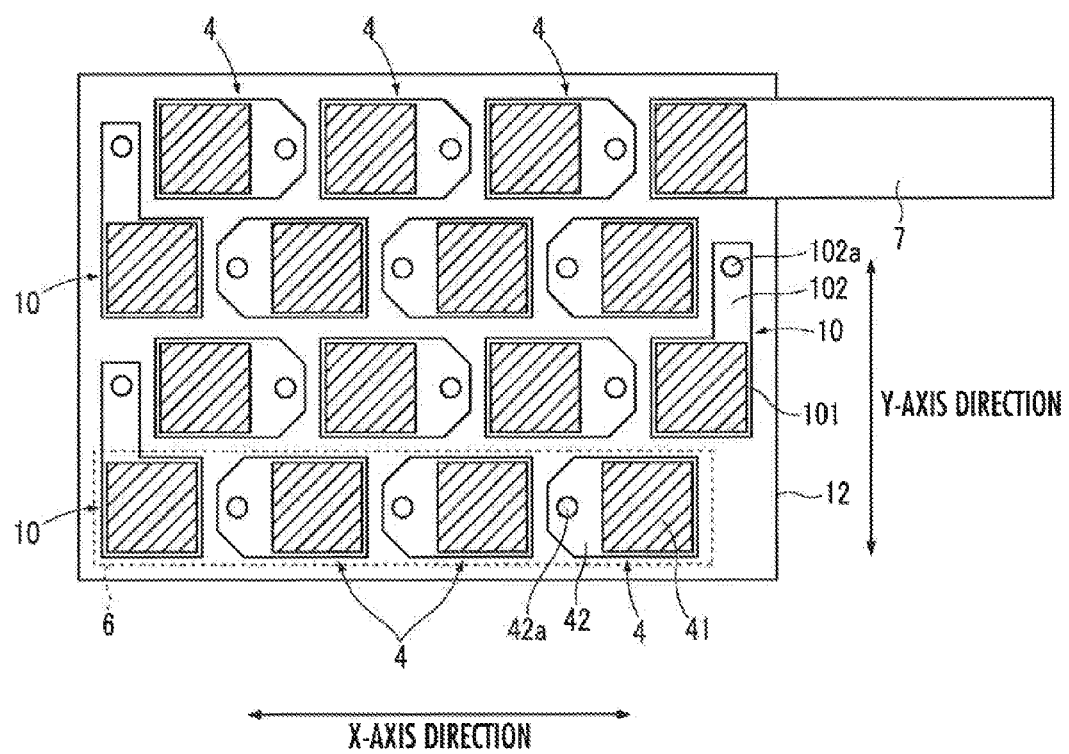
FIG. 8 is an explanatory view showing electrodes which are arranged on a substrate on the upper side of the thermoelectric conversion module according to the third embodiment.

As shown in FIG. 8, second electrodes 4 are also all formed in a rectangular shape (an oblong shape). Note that an array-to-array connection electrode 10 which connects each adjacent two of the element arrays 6 is firmed in an L-shape on the substrate 12 on the upper side. The array-to-array connection electrode 10 comprises an element arrangement section 101 to which the thermoelectric conversion element 2 is electrically connected and a protruding piece 102 which has a connection hole 102a provided therein. The protruding piece 102 is narrower in the X-axis direction than the element arrangement section 101 and is arranged in a space which is made due to the shift of the thermoelectric conversion elements 2 in the element array 6 adjacent to the protruding piece 102.

In the thermoelectric conversion module 1 according to the third embodiment, a connection section 5 is separate from the electrodes 3 and 4. Thus, a thermoelectric conversion module need not be pushed into a U-shaped connector, unlike a conventional thermoelectric conversion module. This improves mass productivity.

Additionally, since the element arrangement sections 31 or element arrangement sections 41 and protruding pieces 32 or 42 are arranged in the X-axis direction, a gap between the element arrays 6 can be reduced. This allows an increase in the area used exclusively by (the element density of) the thermoelectric conversion elements 2 per unit area in the substrates 11 and 12.

Fourth Embodiment

Figure 9:
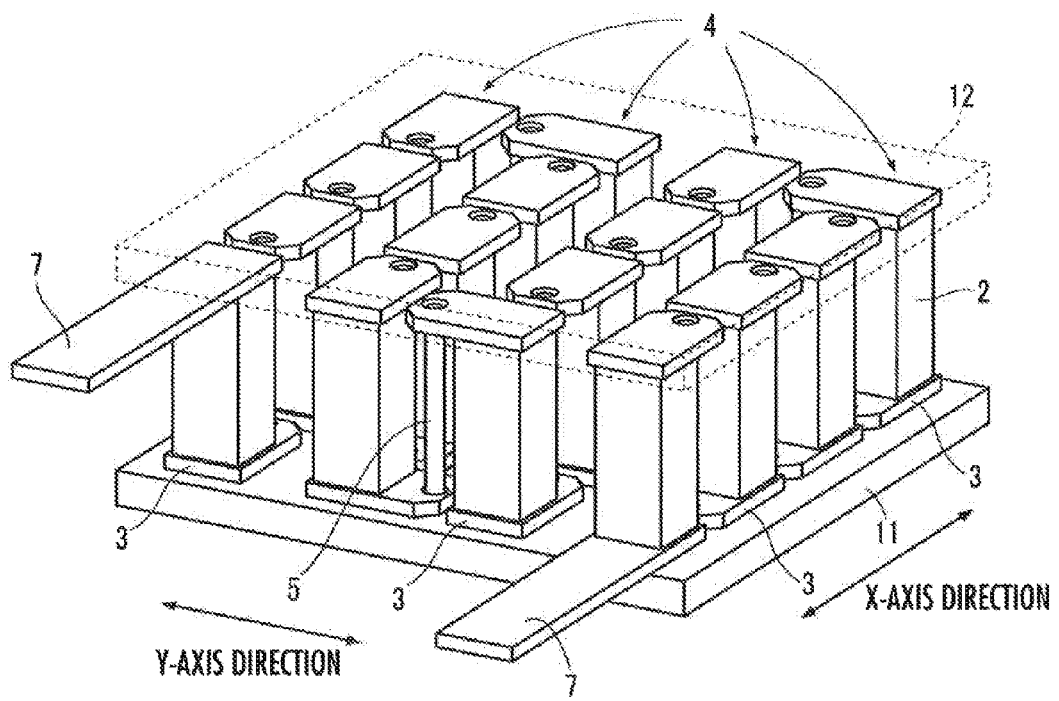
FIG. 9 is a perspective view showing a fourth embodiment of a thermoelectric conversion module according to the present invention.
Figure 10:
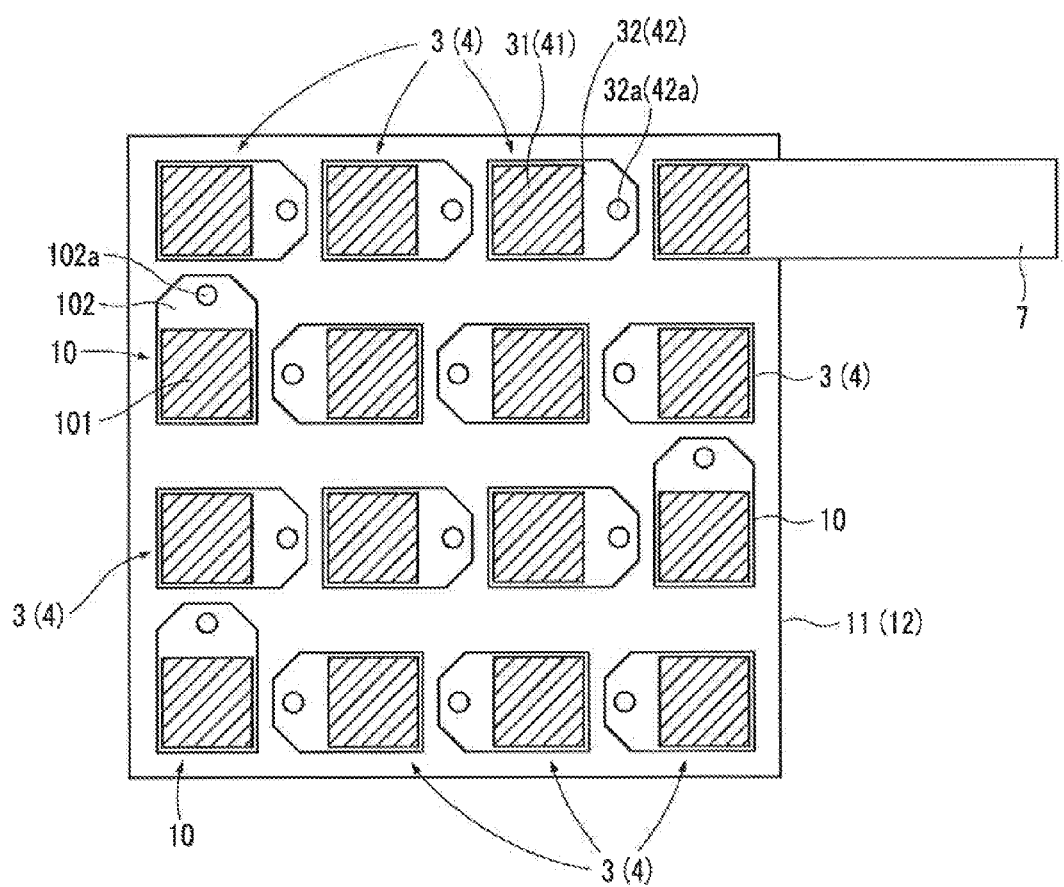
FIG. 10 is an explanatory view showing the arrangement of electrodes according to the fourth embodiment.

A thermoelectric conversion module 1 according to a fourth embodiment will be described with reference to FIGS. 9 and 10. Note that, for better viewability of the interior of the thermoelectric conversion module 1, a substrate 12 which is located on the upper side is indicated by broken lines in FIG. 9, as if the substrate 12 was transparent.

In the thermoelectric conversion module 1 according to the fourth embodiment, the array-to-array connection electrode 10 according to the third embodiment is configured to have the same shape as that of the first electrode 3, and one pair of substrates 11 and 12 and electrodes 3 and 4 arranged thereon are firmed such that the upper and lower sides have the same shape. Since the two substrates 11 and 12 have the same shape, and the electrodes 3 and 4 arranged thereon have the same shape, the third embodiment is excellent in mass productivity, as in the first embodiment and the second embodiment.

Note that since a gap in a Y-axis direction between element arrays 6 is larger than in the third embodiment, the area used exclusively by (the element density of) thermoelectric conversion elements 2 per unit area is inferior than in the third embodiment.

Fifth Embodiment

Figure 11:
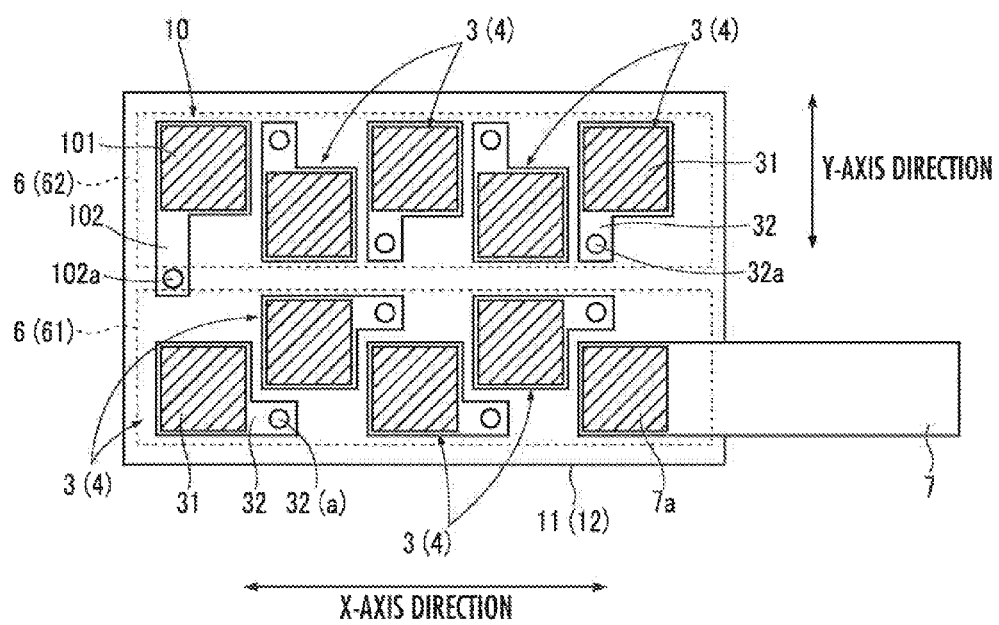
FIG. 11 is an explanatory view showing the arrangement of electrodes of a thermoelectric conversion module.

A thermoelectric conversion module 1 according to a fifth embodiment will be described with reference to FIG. 11. FIG. 11 shows substrates 11 and 12 of the thermoelectric conversion module 1 according to the fifth embodiment and electrodes 3 and 4 which are arranged on the substrates 11 and 12. In the thermoelectric conversion module 1 according to the fifth embodiment, the rectangular electrode 9 and the array-to-array connection electrode 10 according to the first embodiment are made into L-shaped electrodes, and the other components are the same as those in the first embodiment.

In the thermoelectric conversion module 1 according to the fifth embodiment, all the electrodes 3 and 4 except for a terminal 7 and an array-to-array connection electrode 10 can have the same shape, which allows further improvement in mass productivity.

REFERENCE SIGNS LIST 1 thermoelectric conversion module
11, 12 substrate
2 thermoelectric conversion element
3 first electrode
31 element arrangement section
32 protruding piece
32a connection hole
4 second electrode
41 element arrangement section
42 protruding piece
42a connection hole
5 connection section
6 element array
61 first element array
62 second element array
7 terminal
8 L-shaped electrode
9 rectangular electrode
10 array-to-array connection electrode

The invention claimed is:

1. A thermoelectric conversion module comprising:
   one pair of substrates;
   a plurality of thermoelectric conversion elements, each having one end portion electrically connected to a first electrode which is arranged on one of the substrates and the other end portion electrically connected to a second electrode which is arranged on the other of the substrates; and
   a connection section which electrically connects the first electrode electrically connected to the thermoelectric conversion element to the second electrode electrically connected to an adjacent one of the thermoelectric conversion elements,
   wherein the plurality of thermoelectric conversion elements are composed of only one of n-type thermoelectric conversion elements and p-type thermoelectric conversion elements,
   the connection section is intended to electrically connect adjacent two of thermoelectric conversion elements in series and is separate from the first electrode and the second electrode,
   the first electrode and the second electrode each comprises an element arrangement section which is electrically connected to the thermoelectric conversion element and a protruding section which protrudes from the element arrangement section along the substrates, and
   protruding each of the protruding sections of the first and second electrodes has a connection hole provided therein into which the connection section is inserted.

2. The thermoelectric conversion module according to claim 1, wherein
   the connection section has a rod shape or a plate shape and is inserted in the connection holes of the first and second electrodes which are provided in the protruding sections to be electrically connected to the first electrode and the second electrode,
   two axes which extend along the substrates and are orthogonal to each other are assumed to be an X-axis and a Y-axis,
   a plurality of the thermoelectric conversion elements arranged in a direction of the X-axis on the substrates constitute an element array,
   a plurality of the element arrays are arranged in a direction of the Y-axis,
   the thermoelectric conversion elements in the element arrays are staggered,
   first electrodes or second electrodes that are L-shaped are arranged on a substrate on a side where a terminal, from which electricity is derived, of the element array that is provided with the terminal is arranged,
   the L-shaped first electrodes or second electrodes each have the connection hole arranged in the direction of the X-axis side with respect to the element arrangement section, and
   the connection hole of the electrodes in an element array adjacent, to the element array with the L-shaped first electrodes or second electrodes arranged therein is arranged in the Y-axis direction side with respect to the element arrangement section.

3. The thermoelectric conversion module according to claim 2, wherein
an even number of the element arrays are arranged in the direction of the Y-axis,
the first electrodes and the second electrodes arranged on the pair of substrates are arranged in a same pattern on corresponding substrates by being arranged on the substrates so as to be symmetric with respect to the direction of the Y-axis.

4. The thermoelectric conversion module according to claim 3, wherein
electrodes in an element array adjacent to the element array with the L-shaped first electrodes or second electrodes arranged therein each have a rectangular shape, and at least one of two comets at a distal end of the protruding section is notched.

5. The thermoelectric conversion module according to claim 2, wherein
electrodes in an element array adjacent to the element array with the L-shaped first electrodes or second electrodes arranged therein each have a rectangular shape, and at least one of two corners at a distal end of the protruding section is notched.

6. The thermoelectric conversion module according to claim 1, wherein
two axes which extend along the substrates and are orthogonal to each other are assumed to be an X-axis and a Y-axis,
a plurality of the thermoelectric conversion elements arranged in a direction of the X-axis on the substrates constitute an element array,
a plurality of the element arrays are arranged in a direction of the Y-axis,
the thermoelectric conversion elements are arranged at positions shifted in the direction of the X-axis between the adjacent two of the element arrays,
among one of the first electrodes and the second electrodes, an array-to-array connection electrode which connects the adjacent two of the element arrays is formed in an L-shape in a current path through which current produced through thermoelectric conversion flows, and
the protruding section is narrower than the element arrangement section and is arranged in a space which is made due to the shift of thermoelectric conversion elements in the element array adjacent to the protruding section.

\* \* \* \* \*